United States Patent
Lin et al.

(10) Patent No.: US 9,741,575 B2
(45) Date of Patent: Aug. 22, 2017

(54) CVD APPARATUS WITH GAS DELIVERY RING

(71) Applicant: Taiwan Semiconductor Manufacturing Co., Ltd., Hsin-Chu (TW)

(72) Inventors: Hsiang-Wei Lin, New Taipei (TW); Chia-Ho Chen, Zhubei (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

(21) Appl. No.: 14/202,308

(22) Filed: Mar. 10, 2014

(65) Prior Publication Data
US 2015/0252475 A1    Sep. 10, 2015

(51) Int. Cl.
C23C 16/455        (2006.01)
H01L 21/285        (2006.01)

(52) U.S. Cl.
CPC .... *H01L 21/28506* (2013.01); *C23C 16/4558* (2013.01); *C23C 16/45519* (2013.01);
(Continued)

(58) Field of Classification Search
CPC ..... B08B 2205/005; B08B 5/02; B64C 21/00; B64C 21/005; B64C 21/02–21/08;
(Continued)

(56) References Cited

U.S. PATENT DOCUMENTS 2,052,869 A * 9/1936 Coanda .......................... 239/418
2,720,425 A * 10/1955 Coanda ............................ 406/79
(Continued)

FOREIGN PATENT DOCUMENTS

CN            101924015 A    12/2010
DE    WO 2011124686 A1 * 10/2011 .......... B01F 3/04049
(Continued)

OTHER PUBLICATIONS

Terry Day. "The Coanda Effect and Lift. Copyright 2008." pp. 1-27. Source location: http://www.vortex-dynamics.com.au/lift.html. Available: http://www.newfluidtechnology.com.au/wp-content/uploads/THE_COANDA_EFFECT_AND_LIFT.pdf. Accessed: Dec. 12, 2014.*
(Continued)

*Primary Examiner* — Parviz Hassanzadeh
*Assistant Examiner* — Stanislav Antolin
(74) *Attorney, Agent, or Firm* — Eschweiler & Potashnik, LLC

(57) ABSTRACT

The present disclosure relates to a chemical vapor deposition apparatus and associated methods. In some embodiments, the CVD apparatus has a vacuum chamber and a gas import having a gas import axis through which a process gas is imported into the vacuum chamber and being arranged near an upper region of the vacuum chamber. At least one exhaust port is arranged near a bottom region of the vacuum chamber. The CVD apparatus also has a gas delivery ring with an outlet disposed under the gas import. A pressure near the outlet of the gas delivery ring is smaller than that of the rest of the vacuum chamber.

20 Claims, 4 Drawing Sheets

(52) U.S. Cl.
CPC .. *C23C 16/45565* (2013.01); *C23C 16/45574* (2013.01); *C23C 16/45591* (2013.01)

(58) Field of Classification Search
CPC ........ B64C 2230/00; B64C 2230/02–2230/28;
B64C 23/005; C23C 16/4411; C23C
16/45502–16/45508; C23C 16/4551;
C23C 16/45517; C23C
16/45519–16/45521; C23C 16/45557;
C23C 16/45561; C23C
16/45563–16/45578; C23C 16/4558;
C23C 16/45587–16/45591; C23C 16/458;
C23C 16/463; F15C 1/08; F15C 3/10;
H01J 37/3244; H01J 37/32449; H01L
21/02271; H01L 21/0262; H01L
21/28506; H01L 21/32051; H01L
21/67017; H01L 21/67103; H01L
21/67109; H01L 21/67115; H01L
23/4336; Y10T 137/206; Y10T 137/2076;
Y10T 137/2081; B01F 15/00032; B01F
3/04049; B01F 5/0405; B01F 5/0413;
B01F 5/0415; B01F 5/043; B05B
15/0208; B05B 7/00; B05B 7/0075; B05B
7/062; B05B 7/065; B05B 7/066; F04F
5/04; F04F 5/462; F04F 5/463; F04F
5/466
See application file for complete search history.

(56) References Cited

U.S. PATENT DOCUMENTS

| | | | | |
|---|---|---|---|---|
| 2,988,139 | A * | 6/1961 | Coanda | 431/263 |
| 3,047,208 | A * | 7/1962 | Coanda | 417/174 |
| 3,795,367 | A * | 3/1974 | Mocarski | 239/265.17 |
| 3,885,891 | A * | 5/1975 | Throndson | 417/196 |
| 5,338,363 | A * | 8/1994 | Kawata et al. | 118/725 |
| 6,059,885 | A * | 5/2000 | Ohashi | C23C 16/4401 |
| | | | | 118/715 |
| 6,103,304 | A * | 8/2000 | Mizuno | C23C 16/4412 |
| | | | | 118/715 |
| 6,125,788 | A * | 10/2000 | Hills | H01J 37/32082 |
| | | | | 118/723 MP |
| 6,243,966 | B1 * | 6/2001 | Lubomirsky | H01L 21/67017 |
| | | | | 118/715 |
| 6,553,932 | B2 | 4/2003 | Liu et al. | |
| 6,896,475 | B2 * | 5/2005 | Graziosi et al. | 415/1 |
| 7,074,298 | B2 | 7/2006 | Gondhalekar et al. | |
| 8,092,166 | B2 * | 1/2012 | Nicolas et al. | 415/209.2 |
| 9,023,002 | B2 * | 5/2015 | Robinson et al. | 604/319 |
| 9,028,459 | B2 * | 5/2015 | Coulthard et al. | 604/319 |
| 2002/0000202 | A1 * | 1/2002 | Yuda et al. | 118/723 ER |
| 2002/0014471 | A1 * | 2/2002 | Donohoe et al. | 216/67 |
| 2002/0078893 | A1 * | 6/2002 | Os | C23C 16/4558 |
| | | | | 118/723 I |
| 2004/0216671 | A1 * | 11/2004 | Carpenter | C23C 16/45519 |
| | | | | 118/715 |
| 2007/0189909 | A1 * | 8/2007 | Youn | B08B 15/002 |
| | | | | 417/248 |
| 2009/0032130 | A1 * | 2/2009 | Dumas | F15C 1/008 |
| | | | | 137/829 |
| 2009/0060710 | A1 * | 3/2009 | Gammack | F04D 25/06 |
| | | | | 415/90 |
| 2009/0060711 | A1 * | 3/2009 | Gammack et al. | 415/90 |
| 2009/0200268 | A1 * | 8/2009 | Tappan et al. | 216/67 |
| 2010/0140416 | A1 * | 6/2010 | Ohanian et al. | 244/23 A |
| 2010/0150699 | A1 * | 6/2010 | Nicolas et al. | 415/90 |
| 2011/0023782 | A1 * | 2/2011 | Han | C23C 16/45565 |
| | | | | 118/724 |
| 2011/0186226 | A1 * | 8/2011 | Sudou et al. | 156/345.33 |
| 2011/0198417 | A1 * | 8/2011 | Detmar et al. | 239/569 |
| 2012/0000422 | A1 * | 1/2012 | Lam et al. | 118/715 |
| 2012/0237885 | A1 * | 9/2012 | Alexander | H01L 21/67109 |
| | | | | 432/5 |
| 2012/0269968 | A1 * | 10/2012 | Rayner, Jr. | C23C 16/452 |
| | | | | 427/255.26 |
| 2013/0068852 | A1 * | 3/2013 | Wurz | B01F 3/04049 |
| | | | | 239/8 |
| 2013/0098455 | A1 * | 4/2013 | Ng et al. | 137/1 |
| 2014/0034039 | A1 * | 2/2014 | Qi | F24F 1/01 |
| | | | | 126/299 D |
| 2015/0072609 | A1 * | 3/2015 | Bromley | A61G 13/108 |
| | | | | 454/187 |

FOREIGN PATENT DOCUMENTS

| | | | | |
|---|---|---|---|---|
| GB | 2500672 A | * | 10/2013 | .......... A61G 13/108 |
| GB | WO 2013144582 A2 | * | 10/2013 | .......... A61G 13/108 |
| NO | WO 2009054732 A1 | * | 4/2009 | .......... B65G 47/911 |

OTHER PUBLICATIONS

U.S. Appl. No. 61/432,775, filed Jan. 14, 2011 and entitled "Apparatus and Method Utilizing Forced Convection for Uniform Thermal Treatment of Thin Film Devices."*
Richard Mason et al. "Bladeless is More: Fluid Flow Simulation Advances Acclaimed New Fan Design." ANSYS Advantage vol. IV, No. 2, 2010, pp. 5-7. Source location: Ansys, Inc.: http://www.ansys.com/. Available: http://resource.ansys.com/staticassets/ANSYS/staticassets/resourcelibrary/article/AA-V4-I2-Full-Version.pdf. Accessed: Nov. 22, 2016.*
Michael Hua et al. "Studying Near-Surface Effects of the Dyson Air-Multiplier Airfoil." 2011. pp. 1-8. Source location: Department of Mechanical Engineering, University of Rochester. Available: http://www.me.rochester.edu/courses/ME241.gans/G12Dyson.pdf. Accessed: Nov. 22, 2016.*
Kim, et al. "Effects of Showerhead Shapes on the Flowfields in a RF-PECVD Reactor." Surface & Coatings Technology 193 (2005) 88-93. 6 Pages.

* cited by examiner

CVD APPARATUS WITH GAS DELIVERY RING

BACKGROUND

In the fabrication of integrated circuits (ICs), chemical vapor deposition (CVD) is one of the important processes to form thin layers or films on a substrate. In the CVD process, the substrate is exposed to a precursor gas which reacts at the surface of the substrate and deposits a product of the reaction thereon.

A current trend of the CVD apparatus design is towards processing single wafer of large size, which can be integrated with other manufacturing process steps. As substrate size increases, approaches such as gas distribution systems, substrate heating and cooling systems and chamber constructions, design and symmetry among other approaches are studied to form uniform film, in other words, film with less variation of thickness, on the substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
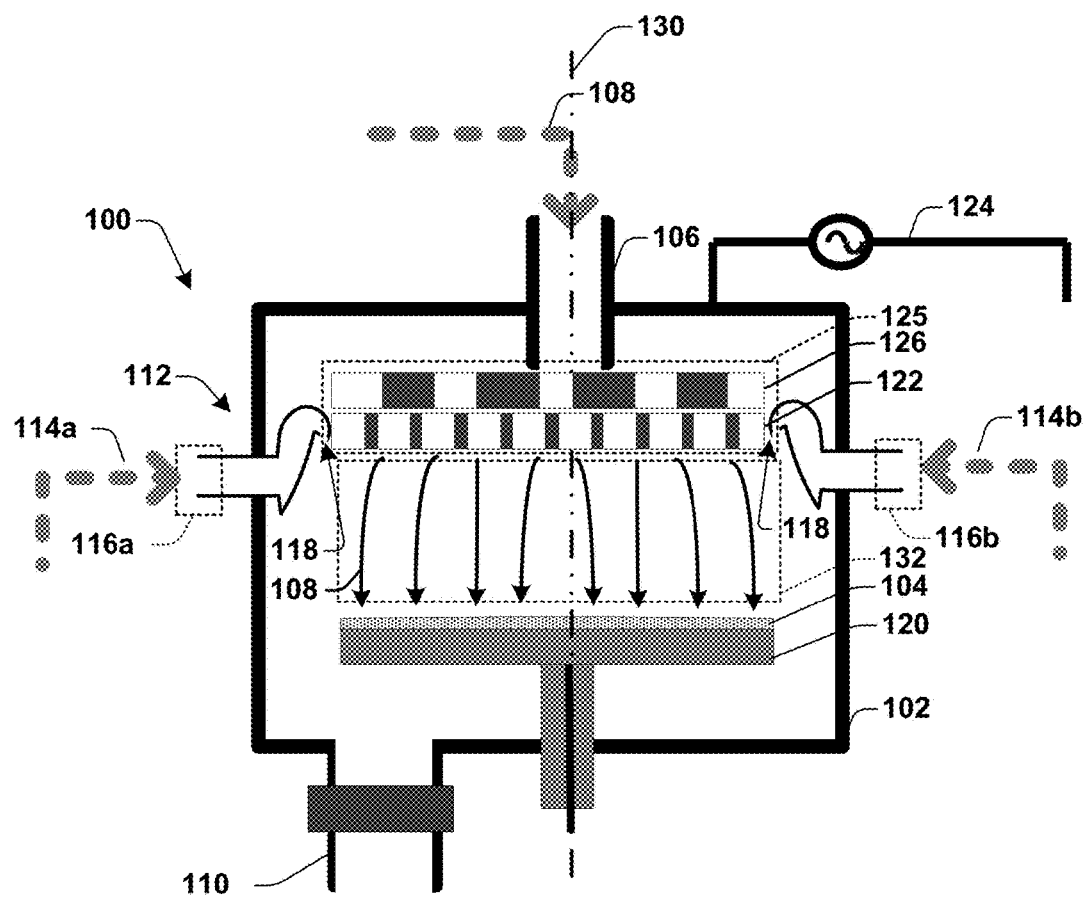
FIG. 1 shows a cross-sectional view of a CVD apparatus in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 3:
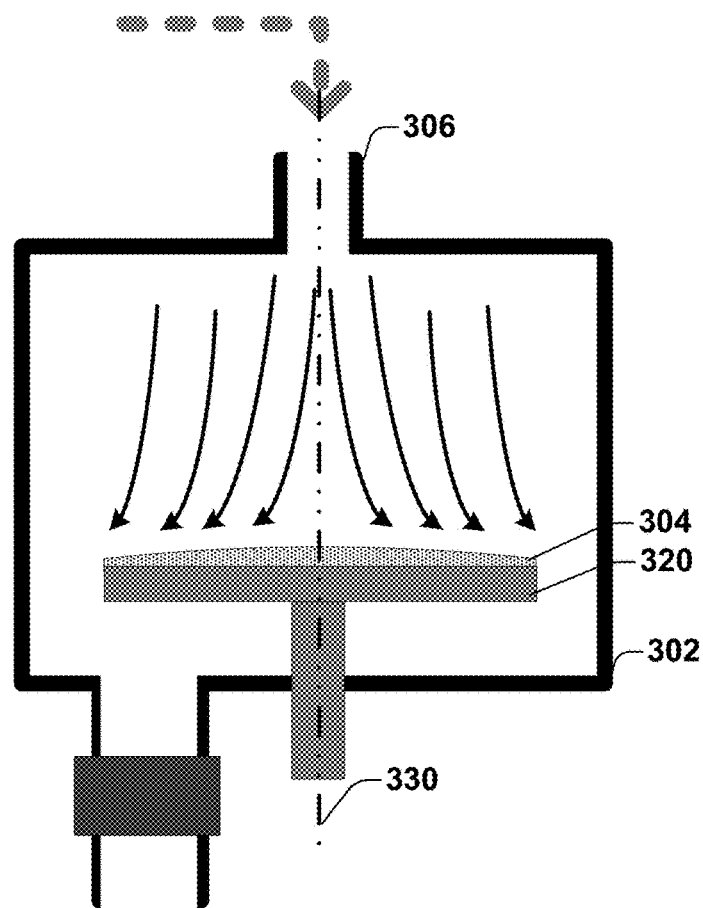
FIG. 3 shows a cross-sectional view of a CVD apparatus which suffers from some shortcomings.
Figure 4:
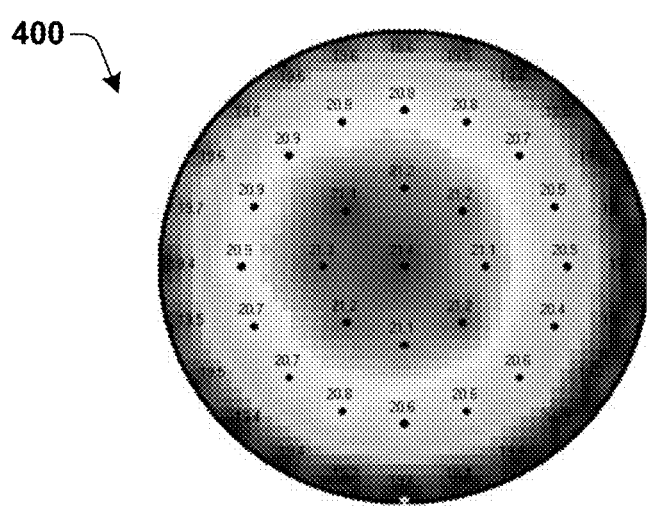
FIG. 4 shows a CVD processed substrate which suffers from some shortcomings.

For large substrate sizes, for example, silicon wafer having diameters of 200 mm to 300 mm, or even 450 mm or more, it is difficult to distribute process gases uniformly on a substrate. As a result, deposited films on the substrate are typically center thick or edge thick and in either instance tend to be non-uniform. For example, in FIG. 3, process gases are imported into a CVD chamber through a gas import 306 along an axis 330 of the chamber. The process gases pass through the chamber and reach a substrate 304. Material deposited on the substrate is gradually thinning from center to edge. FIG. 4 shows an example of gradient thickness of a substrate 400 after CVD process. As shown in FIG. 4, a center region of the substrate has a film with a thickness of approximately 21 Å, while an edge region of the substrate has a thinner film with a thickness of only about 19 Å. This is an example of a non-uniform deposition.

FIG. 1 shows a cross-sectional view of a CVD apparatus 100 in accordance with some embodiments. The CVD apparatus 100 comprises a vacuum chamber 102. A gas import 106 is arranged at one side of the vacuum chamber 102, for example, near an upper region of the vacuum chamber 102 with a gas import axis 130. At least one exhaust port 110 is arranged at the opposite side of the vacuum chamber, for example, near a bottom region of the vacuum chamber 102. A process gas 108 is imported into the vacuum chamber 102 from the gas import 106 and passes in a laminar or substantially laminar fashion to the exhaust port 110. A wafer chuck 120 is arranged between the gas import 106 and the exhaust port 110 at a lower section of the vacuum chamber 102. The wafer chuck 120 holds a semiconductor substrate 104, such as a 200 mm, 300 mm, or 450 mm silicon wafer, for example.

A gas delivery ring 112 having a substantially same lateral dimension with the vacuum chamber 102 is arranged in parallel with the wafer chuck 120 and coupled to a sidewall of the vacuum chamber 102. The gas delivery ring 112 is disposed between the gas import 106 and the wafer chuck 120 and close to the gas import 106. The gas delivery ring 112 is configured to redirect the process gas 108 by pressure difference. An outlet 118 of the gas delivery ring 112 delivers a carrier gas 114b at a pressure that is less than that of rest of the vacuum chamber. As a result, part of the process gas 108 is redirected (e.g., "sucked") toward an area that is near the outlet 118 to correct uneven accumulation of the process gas 108 at an center region of the wafer chuck 120 at which the center of a substrate 104 is placed. Thus, the redirected gas 132 uniformly reaches the surface of the wafer chuck 120 at central and edge regions of the substrate 104, enabling uniform deposition over the wafer's surface.

A gas distribution system 125 can be arranged between the gas import 106 and the wafer chuck 120 and can be arranged upstream of the gas delivery ring 112 to distribute the process gas 108. In some embodiments, the gas distribution system 125 comprises a block plate 126 attached to the gas import 106 with a plurality of apertures formed there through. The gas distribution system 125 can further comprise a showerhead 122 disposed under the block plate 126 with a lateral dimension approximately equal to that of the wafer chuck 120. In some embodiments, the showerhead 122 has a plurality of apertures formed there through with at least two different diameters. The aperture size(s) and/or aperture arrangement for the block plate 126 can differ from those of the showerhead 122. For example, the block plate 126 has an aperture density smaller than that of the showerhead 122 and an aperture size(s) greater than that of the shower head 122. In some embodiments, the gas delivering ring 112 can be attached to an outer sidewall of the showerhead 122.

In some embodiments, the CVD apparatus 100 can be a plasma-enhanced chemical vapor deposition (PECVD), atmospheric pressure CVD, or metalorganic CVD apparatus. The upper region of the vacuum chamber 102 is a dome or a flange. The wafer chuck 120 has a diameter that is substantially same as that of the gas delivery ring 112 and is moveable vertically along the axis 130. The moveable wafer chuck 120 is used to adjust its location in the chamber 102. A heating system or cooling system can be included in the wafer chuck 120 to heat or cool the semiconductor substrate 104 and/or arranged to heat or cool walls of the vacuum chamber 102. A DC power source or a RF power source 124 can be attached to the chamber 102 to create plasma in plasma enhanced CVD process.

Figure 2A:
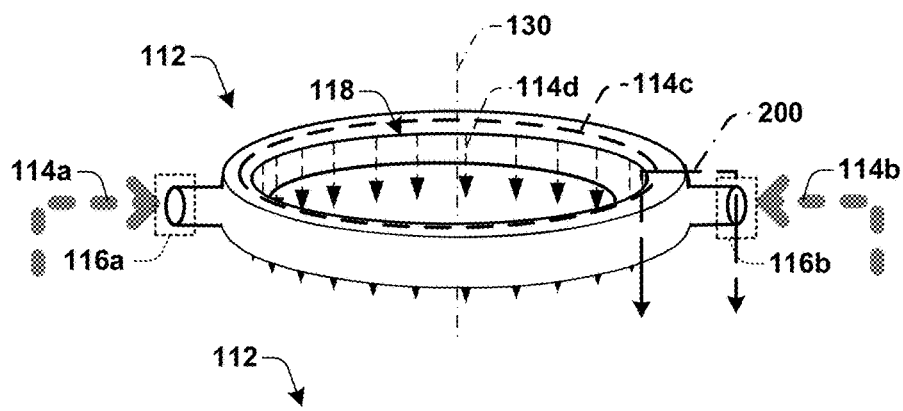
FIG. 2a shows a perspective view of part of a CVD apparatus—a gas delivery ring structure in accordance with some embodiments

FIG. 2a shows a perspective view of part of a CVD apparatus, corresponding to the gas delivery ring 112 in FIG. 1 according to some embodiments. The gas delivery ring 112 can comprise a sidewall with at least two inlets 116a and 116b attached on the vacuum chamber sidewall and arranged symmetrically about the inlet axis 130. Thus, the inlet axis 130 passes through a center of the gas delivery ring 112. The inlets 116a and 116b can be disposed outside the vacuum chamber, and outlet 118 is illustrated as being a continuous opening extending entirely around an inner or outer sidewall of the gas delivery ring. A gas flow 114a, 114b, for example, a carrier gas, is imported from the inlets 116a and 116b and flows through the ring (114c) before being expelled from the outlet 118. The gas inlets 116a and 116b can have a cross-sectional area that is larger than that of the outlet 118, which results in the outlet 118 having a stream of high speed gas molecules 114d which provide a cylindrically shaped low pressure region above the outer circumferential edge of the substrate (e.g., FIG. 1, 104). This cylindrically-shaped low pressure region tends to pull process gas 108 towards the vacuum chamber sidewalls without disrupting the substantially laminar downward flow of process gas 108 from gas import 106 towards substrate 104. The end result is a more uniform film thickness being deposited on the substrate 104 after deposition is complete.

In other embodiments, rather than the outlet 118 being a continuous opening that extends entirely around an inner sidewall of the ring structure, the outlet 118 could comprise a series of discrete or separate openings. In these alternate embodiments, the discrete or separate openings are usually symmetrically spaced at an outer or inner circumferential surface of the gas delivery ring 112. The openings can be formed in a single row around the inner circumferential surface or can be formed distributed across multiple rows around the inner circumferential surface.

Figure 2B:
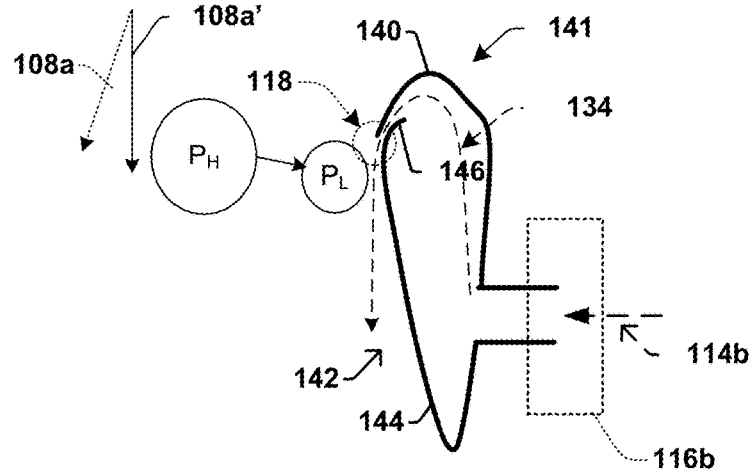
FIG. 2b shows a cross-sectional view of a gas delivery ring structure in accordance with some embodiments.
Figure 2C:
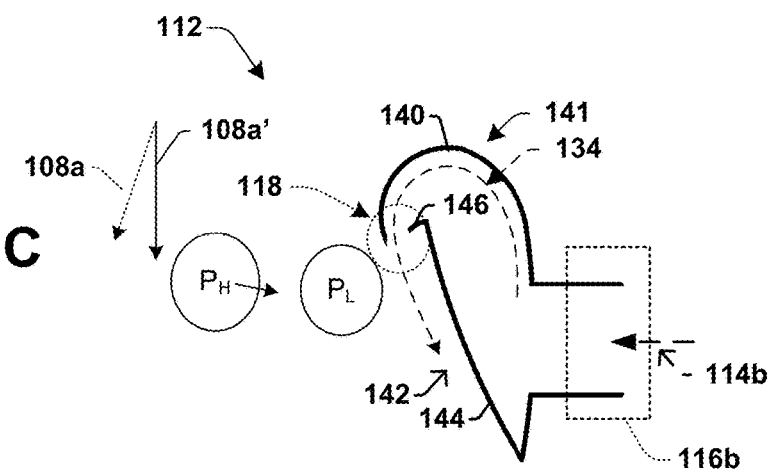
FIG. 2c shows a cross-sectional view of another gas delivery ring structure in accordance with some embodiments.

FIGS. 2b and 2c show two more detailed cross-sectional views of a gas delivery ring 112 corresponding to cut-away line 200 in FIG. 2a.

In FIG. 2b, the carrier gas 114b travels in a curved path shown by arrow 134. These high speed gas molecules induce a low pressure ($P_L$) near the outlet 118, wherein the low pressure $P_L$ is smaller than a high pressure ($P_H$) in the rest of the vacuum chamber. Hence, for process gas molecules 108a, which are passing near the outlet 118, the low pressure region induces a directional change for the gas molecules and diverts them to altered path 108a'. This altered path 108a', when impingent on a substrate, promotes greater deposition uniformity than conventional approaches.

The outlet 118 in FIG. 2b can be arranged at an upper section of the gas delivery ring 112. In particular, an upper region 141 of the gas delivery ring 112 has a curved surface 140 that overhangs a lower region 142 of the gas delivery ring 112, such that the outlet 118 is defined by the overhang dimension. To help promote the desired flow, the lower region 142 of the gas delivery ring includes an inner sidewall portion 144 that is downwardly angled at an angle that is non-parallel to sidewalls of the vacuum chamber. A lip or flange 146 may extend from an uppermost region of the lower region of the gas delivery ring toward the outlet 118 to further help establish the desired flow pattern.

Whereas FIG. 2b's embodiment directs the carrier gas 114b in a downward direction that is perpendicular to the face of substrate (e.g., FIG. 1, 104), applicants note that the present disclosure is not necessarily limited in this regard. For example, FIG. 2c shows another example where the carrier gas is expelled at a slight angle towards the vacuum chamber sidewalls (e.g., a slight non-normal angle as measured relative to the face of substrate 104). This arrangement of FIG. 2c may pull the laminar process gas 108 further toward the vacuum chamber sidewall than the arrangement of FIG. 2b, while still keeping substantially laminar flow for process gas 108 without introducing significant turbulence in the vacuum chamber. Accordingly, even though FIG. 2b is a preferred implementation, FIG. 2c represents another possible implementation. Still further, in some other embodiments, the flow of carrier gas could even be directly slightly into the chamber (i.e., away from the vacuum chamber sidewalls) so long as substantially laminar flow is retained to promote uniform deposition over the face of substrate 104.

Figure 5:
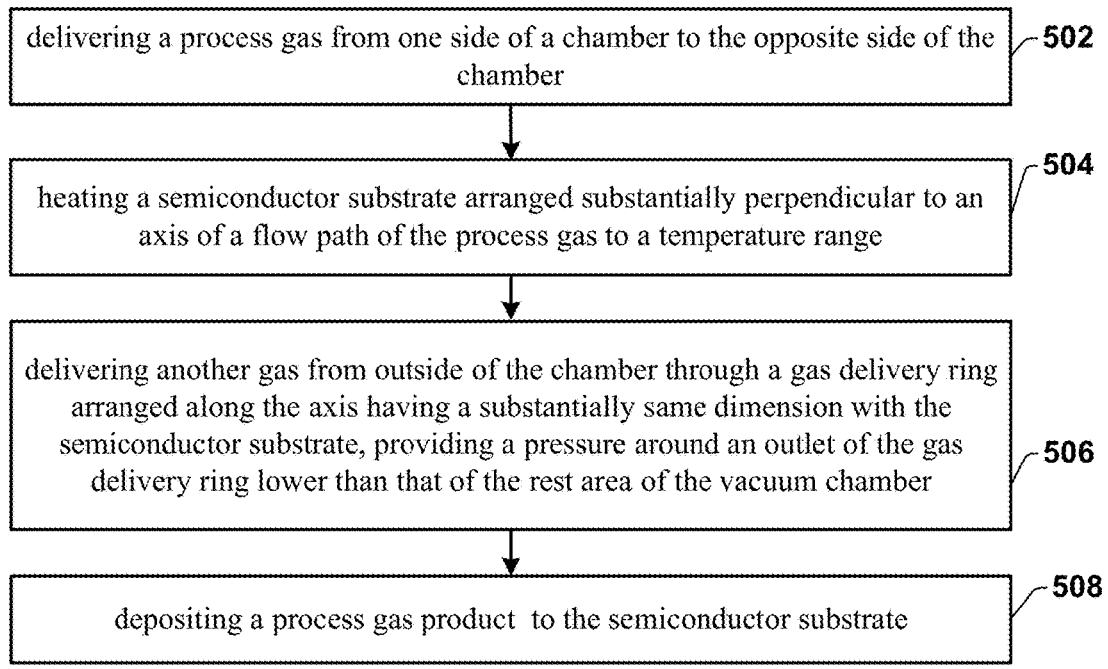
FIG. 5 shows a flow diagram of a method of chemical vapor deposition in accordance with some embodiments.

FIG. 5 shows a flow diagram of a method of chemical vapor deposition according to some embodiments.

At 502, a process gas is delivered from one side of a chamber to the opposite side of the chamber. The chamber can be horizontal or vertical tube reactors, showerhead reactors, atmospheric pressure CVD reactors, metalorganic CVD reactor, photo induced CVD reactors or plasma enhanced CVD reactors among other types of chambers.

At 504, a semiconductor substrate arranged substantially perpendicular to an axis of a flow path of the process gas is heated to a temperature range.

At 506, another gas is delivered from outside of the chamber through a gas delivery ring arranged along the axis having a substantially same dimension with the semiconductor substrate, providing a pressure around an outlet of the gas delivery ring lower than that of the rest area of the chamber.

At 508, a process gas product is deposited to the semiconductor substrate. The process gas is guided by a pressure difference between an area around the outlet of the gas delivery ring and the rest area of the chamber such that the process gas deposited to the semiconductor substrate become uniform.

In general, the present disclosure is related to an optimized CVD apparatus in order to achieve uniform deposition. More particularly, the present disclosure is about attaching a gas delivery ring to a CVD chamber to redistribute process gas by changing a pressure at selective region. As a result, uniformity of the CVD film deposited on the substrate is improved.

Thus, it will be appreciated that some embodiments relate to a CVD apparatus. The CVD apparatus comprises a vacuum chamber. The CVD apparatus further comprises a gas import having a gas import axis through which a process gas is imported into the vacuum chamber and being arranged near an upper region of the vacuum chamber and at least one exhaust port arranged near a bottom region of the vacuum chamber. The CVD apparatus further comprises a gas delivery ring with an outlet disposed under the gas import. A pressure near the outlet of the gas delivery ring is smaller than that of the rest of the vacuum chamber.

Other embodiments relate to an apparatus for distributing a process gas with a semiconductor substrate processing chamber. The apparatus comprises a gas import disposed at one side of the chamber and an exhaust port disposed at the opposite side of the chamber. The process gas flows through the chamber from the gas import to the exhaust port. The apparatus further comprises a wafer chuck arranged between the gas import and the exhaust port to hold a semiconductor substrate. The apparatus further comprises a gas delivery ring arrange in parallel with the wafer chuck closed to the gas import having a lateral dimension that is substantially same as that of the wafer chuck. The apparatus further comprises a gas source which delivers gas to an inlet of the gas delivery ring and which is disposed outside the chamber. The gas flows from the inlet of the gas delivery ring to an outlet of the gas delivery ring.

Still other embodiments relate to a method of chemical vapor deposition. In this method, a process gas is delivered from one side of a vacuum chamber to the opposite side of the vacuum chamber. A semiconductor substrate arranged substantially perpendicular to an axis of a flow path of the process gas is heated to a temperature range. Another gas is delivered from outside of the vacuum chamber through a gas delivery ring arranged along the axis having a substantially same dimension with the semiconductor substrate, providing a pressure around an outlet of the gas delivery ring lower than that of the rest area of the vacuum chamber. And a process gas product is deposited onto the semiconductor substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chemical vapor deposition (CVD) apparatus comprising:
   a vacuum chamber;
   a wafer chuck having a chuck surface configured to receive a semiconductor substrate;
   a gas import having a gas import axis through which a process gas is imported into the vacuum chamber and being arranged near an upper region of the vacuum chamber;
   at least one exhaust port arranged near a bottom region of the vacuum chamber;
   a showerhead arranged in the upper region of the vacuum chamber and configured to redistribute the process gas from the gas import;
   a gas delivery ring attached to a sidewall of the vacuum chamber over the wafer chuck and between the gas import and the exhaust port; and
   an inert gas supply located external to the vacuum chamber and coupled to the gas delivery ring and configured to deliver an inert gas to an inlet of the gas delivery ring;
   wherein the gas delivery ring is configured to expel the inert gas from an outlet of the gas delivery ring, and wherein the outlet has a smaller cross-sectional area than the inlet, causing the outlet to deliver the inert gas at a first pressure within a cylindrically shaped region above an outer circumferential edge of the semiconductor substrate that is less than a second pressure of a rest of the vacuum chamber, the first pressure is configured to pull a flow of the process gas from the showerhead to redirect the process gas from the showerhead to an area near the outlet;
   wherein the gas delivery ring has a curved outer wall that overlaps a curved inner wall and that protrudes laterally past the curved inner wall to extend to an innermost point of the gas delivery ring, wherein a space between the overlap of the curved outer wall and the curved inner wall defines the outlet in a downward facing direction, wherein the outlet is located between an uppermost point and a lowermost point of the gas delivery ring, wherein the innermost point of the gas delivery ring and the outlet of the gas delivery ring are disposed above a lowermost surface of the showerhead.

2. The CVD apparatus of claim 1, wherein the inlet is located at a lower region of the curved outer wall of the gas delivery ring.

3. The CVD apparatus of claim 1, wherein the gas delivery ring comprises a hollow duct in communication with the outlet and having a lower surface that extends below the lowermost surface of the showerhead.

4. The CVD apparatus of claim 1, wherein the gas delivery ring comprises a hollow duct having an upper region protruding above the inlet and a lower region protruding below of the inlet, wherein the upper region has a greater width than the lower region.

5. The CVD apparatus of claim 1, wherein the outlet of the gas delivery ring comprises a series of separate openings symmetrically spaced at the curved inner wall of the gas delivery ring.

6. The CVD apparatus of claim 1, wherein the gas delivery ring is coupled to a sidewall of the vacuum chamber having a substantially same lateral dimension with that of the vacuum chamber, wherein the gas delivery ring has a spindle shape that is widest at a middle upper region and tapering more sharply at a bottom end than a top end.

7. The CVD apparatus of claim 1, wherein the outlet of the gas delivery ring is located at a widest position of the gas delivery ring, wherein the curved outer wall has an apex located at a topmost point of the gas delivery ring.

8. The CVD apparatus of claim 1, wherein the upper region of the vacuum chamber is a dome or a flange.

9. The CVD apparatus of claim 1, wherein the wafer chuck is moveable and arranged at a lower section of the vacuum chamber.

10. The CVD apparatus of claim 9, wherein the gas delivery ring is configured to redirect the process gas, which flows through the vacuum chamber reaching a surface of the wafer chuck, so the redirected process gas uniformly reaches the surface of the wafer chuck at central and edge regions.

11. The CVD apparatus of claim 9, wherein a lateral dimension of the showerhead is approximately equal to that of the wafer chuck.

12. The CVD apparatus of claim 11, wherein the gas delivery ring is attached to an outer sidewall of the showerhead having a substantially same lateral dimension with that of the vacuum chamber.

13. The CVD apparatus of claim 11, wherein the showerhead further comprises a plurality of apertures formed there through with at least two different diameters.

14. The CVD apparatus of claim 1, further comprising: a heating system or cooling system to heat or cool the semiconductor substrate.

15. The CVD apparatus of claim 1, wherein the CVD apparatus is a plasma-enhanced chemical vapor deposition (PECVD), atmospheric pressure CVD, or metalorganic CVD apparatus.

16. An apparatus for distributing a process gas within a chamber, comprising:
a gas import disposed at one side of the chamber and an exhaust port disposed at an opposite side of the chamber, wherein the process gas flows through the chamber from the gas import to the exhaust port;
a wafer chuck arranged between the gas import and the exhaust port and having a chuck surface to hold a semiconductor substrate;
a showerhead arranged in an upper region of the chamber and configured to redistribute the process gas from the gas import, wherein a lateral dimension of the showerhead is approximately equal to that of the wafer chuck;
a gas delivery ring having a curved outer wall that overlaps a curved inner wall and that protrudes laterally past the curved inner wall to extend to an innermost point of the gas delivery ring, wherein a space between the overlap of the curved outer wall and the curved inner wall defines an outlet in a downward facing direction, wherein the innermost point of the gas delivery ring and the outlet of the gas delivery ring are disposed above a lowermost surface of the showerhead; and
a carrier gas supply external to the chamber and coupled to the gas delivery ring, the carrier gas supply configured to deliver a carrier gas, which is different from the process gas, from external to the chamber to an inlet of the gas delivery ring, wherein the carrier gas flows from the inlet of the gas delivery ring to the outlet of the gas delivery ring;
wherein the outlet has a smaller cross-sectional area than the inlet, causing the outlet to deliver the carrier gas at a first pressure within a cylindrically shaped region above an outer circumferential edge of the semiconductor substrate that is less than a second pressure of a rest of the chamber, the first pressure is configured to pull a flow of the process gas from the showerhead to redirect the process gas from the showerhead to an area near the outlet;
wherein an upper portion of the gas delivery ring, which has a first ring width and includes the outlet, is laterally adjacent to an outermost sidewall of the showerhead, and a lower portion of the gas delivery ring, which has a second ring width that is less than the first ring width, includes the inlet and an angled sidewall which extends downwardly to a height that is below the outlet of the gas delivery ring and the lowermost surface of the showerhead.

17. The apparatus of claim 16, wherein the process gas is redistributed by a pressure difference of an area near the outlet of the gas delivery ring and the rest of the chamber, such that a distribution of the process gas is uniform when flows by the wafer chuck.

18. The apparatus of claim 16, wherein the showerhead has a plurality of apertures formed there-through to redistribute the process gas, wherein the gas delivery ring is attached to the outermost sidewall of the showerhead.

19. A semiconductor substrate processing chamber, comprising:
a gas import disposed at a first region of the chamber and an exhaust port disposed at a second region of the chamber, wherein a process gas flows through the chamber from the gas import and through a gas distribution system to the exhaust port;
a wafer chuck arranged between the gas import and the exhaust port to hold a semiconductor substrate;
a gas delivery ring arranged around an outer sidewall of the gas distribution system and configured to deliver a carrier gas different from the process gas, wherein the gas delivery ring has a curved outer wall that overlaps a curved inner wall and that protrudes laterally past the curved inner wall to extend to an innermost point of the gas delivery ring, wherein a space between the overlap of the curved outer wall and the curved inner wall defines an outlet in a downward facing direction, wherein the innermost point of the gas delivery ring and the outlet of the gas delivery ring are disposed above a lowermost surface of the gas distribution system; and
a carrier gas supply external to the chamber and coupled to the gas delivery ring, the carrier gas supply configured to deliver the carrier gas to a gas inlet of the gas delivery ring;
wherein the outlet of the gas delivery ring is located at an inner sidewall of the gas delivery ring between an uppermost and a lowermost point of the gas delivery ring and is aligned with an edge of the wafer chuck.

20. The semiconductor substrate processing chamber of claim 19, wherein an inlet of the gas delivery ring is separated from the gas import of the chamber and is disposed outside the chamber.

* * * * *